(12) United States Patent
Tsai et al.

(10) Patent No.: US 12,324,108 B2
(45) Date of Patent: Jun. 3, 2025

(54) ELECTRONIC DEVICE

(71) Applicant: Innolux Corporation, Miaoli County (TW)

(72) Inventors: Ming-Han Tsai, Miaoli County (TW); Hsuan-Yin Wang, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 379 days.

(21) Appl. No.: 18/079,855

(22) Filed: Dec. 12, 2022

(65) Prior Publication Data

US 2023/0225062 A1 Jul. 13, 2023

(30) Foreign Application Priority Data

Jan. 13, 2022 (CN) .......................... 202220084078.6

(51) Int. Cl.
*H05K 5/02* (2006.01)

(52) U.S. Cl.
CPC ..................... *H05K 5/02* (2013.01)

(58) Field of Classification Search
None
See application file for complete search history.

(56) References Cited

U.S. PATENT DOCUMENTS

2009/0237586 A1* 9/2009 Han .................. G02F 1/133308
361/679.21
2018/0184534 A1* 6/2018 Na ....................... F16M 11/041

FOREIGN PATENT DOCUMENTS

TW 201421204 6/2014
TW 201944787 11/2019

* cited by examiner

*Primary Examiner* — Jerry Wu
(74) *Attorney, Agent, or Firm* — JCIPRNET (57) ABSTRACT

An electronic device including a first casing and a second casing is provided. The first casing includes a first plate portion, a first position-limiting structure and a second position-limiting structure. The first position-limiting structure and an inner surface of the first plate portion form a position-limiting groove. The second position-limiting structure is disposed on the inner surface of the first plate portion. The second casing includes a protruding structure. The protruding structure is inserted in the position-limiting groove, and the first position-limiting structure and the second position-limiting structure abut two opposite sides of the protruding structure.

19 Claims, 10 Drawing Sheets

ELECTRONIC DEVICE

CROSS-REFERENCE TO RELATED APPLICATION

This application claims the priority benefit of Chinese application no. 202220084078.6, filed on Jan. 13, 2022. The entirety of the above-mentioned patent application is hereby incorporated by reference herein and made a part of this specification.

BACKGROUND

Technical Field

The disclosure relates to an electronic device.

Description of Related Art

Electronic devices are typically used to provide audio and video effects. Therefore, electronic devices integrated with a display function and a sound generating function is common at present. For example, an electronic device may have a built-in speaker to provide the sound generating function. Mechanical vibration generated during sound generation of the speaker may in turn cause vibration of a casing of the electronic device, which may generate an abnormal sound. Therefore, this type of electronic device still has a room for improvement.

SUMMARY

The disclosure is directed to an electronic device, which is adapted to stabilize casings coupled to each other to mitigate an abnormal sound generated by vibration of the casings.

The disclosure provides an electronic device including a first casing and a second casing. The first casing includes a first plate portion, a first position-limiting structure and a second position-limiting structure. The first position-limiting structure and an inner surface of the first plate portion form a position-limiting groove. The second position-limiting structure is disposed on the inner surface of the first plate portion. The second casing includes a protruding structure. The protruding structure is inserted in the position-limiting groove, and the first position-limiting structure and the second position-limiting structure abut two opposite sides of the protruding structure.

In an embodiment of the disclosure, the protruding structure is spaced apart from the inner surface by a distance.

In an embodiment of the disclosure, the above distance is between 0.1 mm and 0.15 mm.

In an embodiment of the disclosure, a length of the second position-limiting structure protruding from the inner surface of the first plate portion is between 0.1 mm and 1.2 mm.

In an embodiment of the disclosure, the first casing further includes a third plate portion. The third plate portion is connected to the first plate portion, and a normal line of the first plate portion and a normal line of the third plate portion are intersected.

In an embodiment of the disclosure, the first position-limiting structure is disposed on the third plate portion. The first position-limiting structure has a first portion and a second portion, the second portion is located between the first portion and the inner surface of the first plate portion, and a length of the first portion protruding from the third plate portion is greater than a length of the second portion protruding from the third plate portion.

In an embodiment of the disclosure, the second position-limiting structure has a hemispherical shape or a columnar shape.

In an embodiment of the disclosure, the first position-limiting structure and the second position-limiting structure are arranged alternately with each other.

In an embodiment of the disclosure, the first position-limiting structure and the second position-limiting structure are spaced apart from each other by 2 mm to 20 mm.

In an embodiment of the disclosure, a difference between a width of the position-limiting groove and a length of the protruding structure is less than a length of the second position-limiting structure protruding from the inner surface of the first plate portion in a direction away from the first plate portion.

In an embodiment of the disclosure, the electronic device further includes a sound generating assembly disposed between the first casing and the second casing.

Based on the above description, since the electronic device includes the first position-limiting structure and the second position-limiting structure that may structurally interfere the first casing and the second casing. When the electronic device is subjected to an external force to vibrate, the first casing and the second casing are not easy to move relative to each other, thereby reducing the abnormal sound generated by collision of the casings.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The disclosure may be understood by referring to the following detailed description with reference of the accompanying drawings. It should be noted that, in order to facilitate the reader's understanding and the conciseness of the drawings, the multiple drawings in the disclosure only depict a part of an electronic device, and specific elements in the drawings are not drawn according to actual scales. In addition, the number and size of each element in the figures are only for illustration, and are not used to limit the scope of the disclosure.

Throughout the specification and claims of the disclosure, certain words are used to refer to specific elements. Those skilled in the art should understand that electronic device manufacturers may refer to the same elements by different names. This specification does not intend to distinguish those elements with the same function but different names. In the following description and claims, the words "include," "contain" and "have" are open-ended words, so they should be interpreted as "including but not limited to . . . ". Therefore, when the terms "including", "containing", and/or "having" are used in the description of the disclosure, they specify existence of corresponding features, regions, steps, operations, and/or components, but do not exclude existence of one or more corresponding features, regions, steps, operations, and/or components.

Directional terminology mentioned in the following embodiments, such as "top," "bottom," "left," "right," "front," "back," etc., is used with reference to the orientation of the FIG(s) being described and are not intended to limit the disclosure. In the FIGs, each of the drawings depicts typical features of methods, structures, and/or materials used in the particular exemplary embodiments. However, these drawings are not to be interpreted as limiting or limiting the scope or property covered by these exemplary embodiments. For example, for clarity, relative thickness and position of each film layer, region and/or structure may be reduced or enlarged.

When a corresponding component (for example, a film layer or region) is referred to as being "disposed or formed on" another component, it may be directly disposed or formed on the other component, or other components may exist there between. On the other hand, when a component is referred to as being "directly disposed on or formed on" another component, there is no other component existing there between. In addition, when a component is referred to as being "disposed or formed on" another component, the two components have an up-down relationship in a top view direction, and the component may be located above or below the other component, and the up-down relationship depends on a device orientation.

It should be understood that when a component or film layer is referred to as being "connected to" another component or film layer, it may be directly connected to the other component or film layer, or there may be intervening components or film layers there between. When a component is referred to as being "directly connected" to another component or layer, there is no intervening component or film layer there between. In addition, when a component is referred to as being "coupled to another component (or a variation thereof)," it may be directly connected to the other component, or indirectly connected (for example, electrically connected) to the other component through one or more components.

The terms "about", "equal to", "equivalent", or "the same", "substantially" or "approximately" mentioned herein generally represent falling within 20% of a given value or range, or represent falling within 10%, 5%, 3%, 2%, 1% or 0.5% of the given value or range.

Terms such as "first", "second", etc. used in the description and the claims are used to modify components, and they do not imply and represent that the (or these) components have any previous ordinal numbers, nor representing an order of a certain component and another component, or an order of a manufacturing method, these ordinal numbers are only used to clearly distinguish a component with a certain name from another component with the same name. The claims and the description may not use the same terms, whereby a first component in the specification may be a second component in the claims.

The electronic device of the disclosure may include a display device, an antenna device, a sensing device, a light emitting device, or a splicing device, but the disclosure is not limited thereto. The electronic device may include a bendable or flexible electronic device. The electronic device may include electronic components. The electronic device includes, for example, a liquid crystal layer or a light emitting diode (LED). The electronic component may include a passive component and an active component, such as a capacitor, a resistor, an inductor, a variable capacitor, a filter, a diode, a transistor, a sensor, an MEMS, a liquid crystal chip, a controller, etc., but the disclosure is not limited thereto. The diode may include a light emitting diode or a photodiode. The light emitting diode may include, for example, an organic light emitting diode (OLED), a mini LED, a micro LED, a quantum dot LED, fluorescence, phosphor or other suitable materials, or a combination thereof, but the disclosure is not limited thereto. The sensor may include, for example, a capacitive sensor, an optical sensor, an electromagnetic sensor, a fingerprint sensor (FPS), a touch sensor, an antenna, or a pen sensor, etc., but the disclosure is not limited thereto. The controller may include, for example, a timing controller, etc., but the disclosure is not limited thereto. Hereinafter, a display device is used as the electronic device to illustrate the content of the disclosure, but the disclosure is not limited thereto.

It should be noted that, in the following embodiments, features in several different embodiments may be replaced, recombined, and mixed to complete other embodiments without departing from the spirit of the disclosure. As long as the features among the embodiments do not violate the spirit of the disclosure or conflict with each other, they may be arbitrarily mixed and matched. In addition, an X-axis, a Y-axis and a Z-axis in the drawings are used to interpret an orientation of each component and a spatial arrangement relationship of the components. In some embodiments, the X-axis, the Y-axis and the Z-axis are perpendicular to each other, but the disclosure is not limited thereto. In some other embodiments, the X-axis, the Y-axis, and the Z-axis may be three axial directions interested with each other in pairs without being necessarily perpendicular to each other. In addition, the terms such as first, second, and third described below are only for the convenience of distinguishing a plurality of the same or similar components, features and/or structures, and do not limit a manufacturing sequence or a stacking sequence of these components, features and/or structures order etc.

Figure 1:
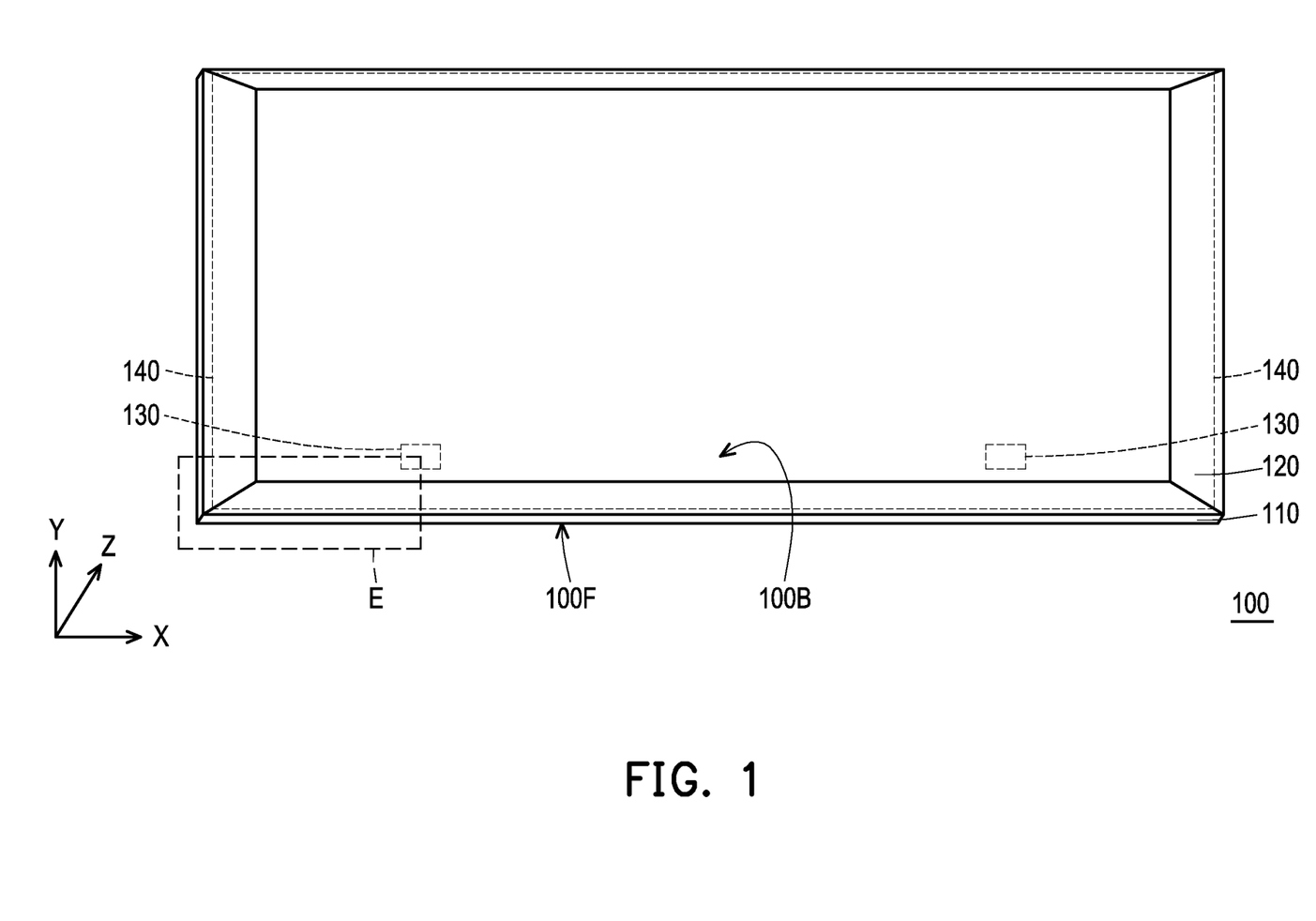
FIG. 1 is a rear three-dimensional view of an electronic device according to some embodiments.
Figure 2:
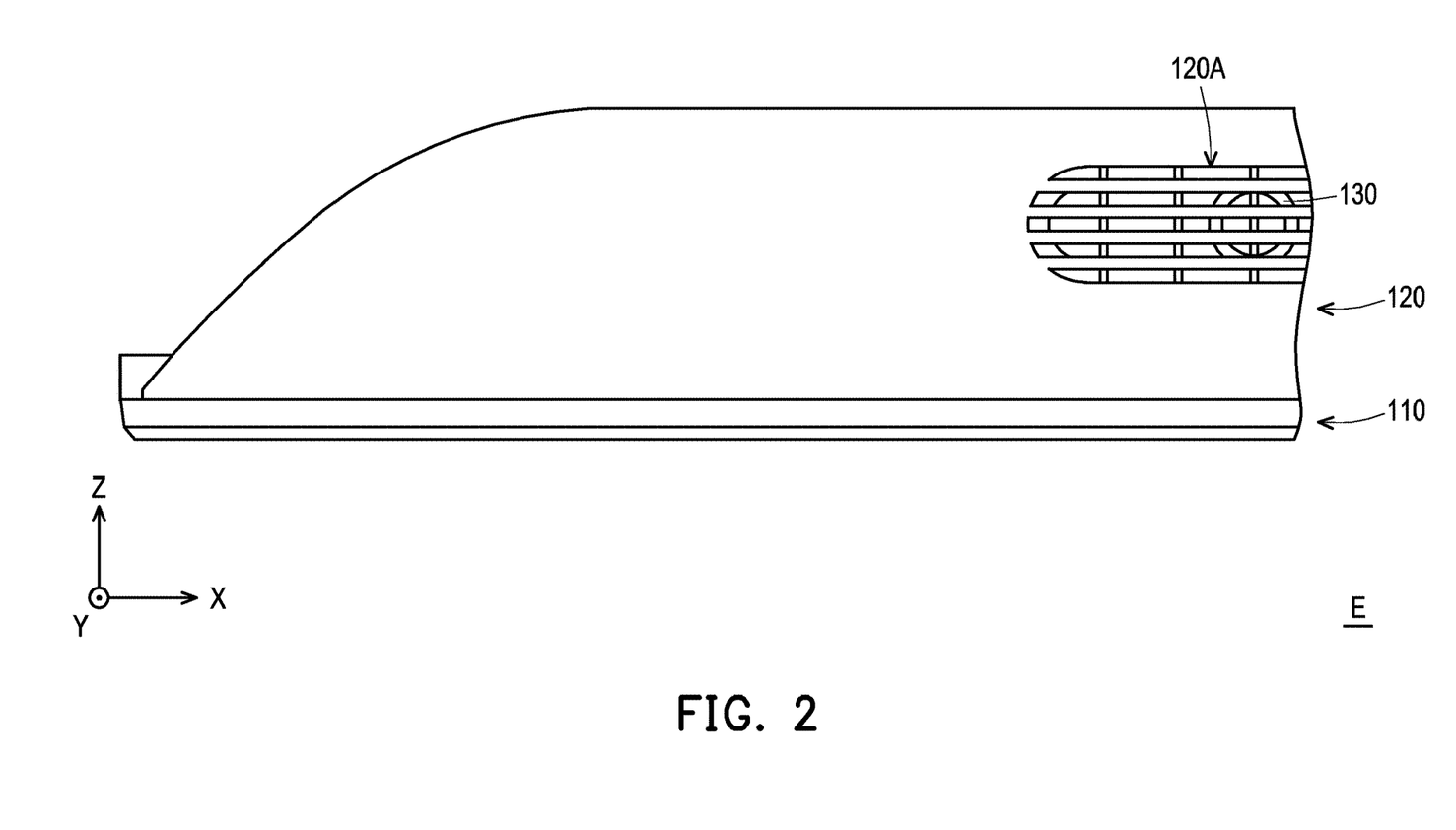
FIG. 2 is a schematic view of a region E of the electronic device viewed along a Y-axis direction.

FIG. 1 is a rear three-dimensional view of an electronic device according to some embodiments. FIG. 2 is a partial enlarged view of a region E in FIG. 1, and FIG. 2 presents a schematic view of the region E of the electronic device viewed along a Y-axis direction. As shown in FIG. 1 and FIG. 2, an electronic device 100 includes a first casing 110 and a second casing 120. The first casing 110 and the second casing 120 are paired to form a casing of the electronic device 100. In the embodiment, a Z-axis direction is, for example, a front-rear direction of the electronic device 100. The first casing 110 is, for example, a front frame of the electronic device 100 and the second casing 120 is, for example, a rear cover of the electronic device. Since FIG. 1 is a three-dimensional view in a rear view direction, a front side 100F of the electronic device 100 is not shown. However, the first casing 110 may have a frame-like shape to enclose an active region (for example, a display region, a touch region, etc.) of the electronic device 100 on the front side 100F of the electronic device 100. The second casing 120 is disposed on a back side 100B of the electronic device 100 to cover and/or protect internal components of the electronic device 100.

In some embodiments, the interior of the electronic device 100 may be provided with a sound generating assembly 130, a panel assembly 140 and other electronic components that are not shown. Since the sound generating assembly 130 and the panel assembly 140 are both disposed in an inner space surrounded by the first casing 110 and the second casing 120, the sound generating assembly 130 and the panel assembly 140 are represented by dashed boxes in FIG. 1. It may be understood that the appearances of the sound generating assembly 130 and the panel assembly 140 are not limited to the boxes shown in FIG. 1. The sound generating assembly 130 includes a speaker, and is generally disposed on a lower portion of the electronic device 100, and may be disposed on the second casing 120, but the disclosure is not limited thereto. In some embodiments, as shown in FIG. 2, the second casing 120 may be provided with a hole 120A corresponding to the sound generating assembly 130 for transmitting sound waves to the outside of the electronic device 100. The panel assembly 140 includes a display panel, a touch display panel, or the like. The panel assembly 140 may provide display, touch or multiple functions, and the panel assembly 140 may be surrounded by the first casing 110. In the embodiment, the electronic device 100 is a device having both display and sound effects, such as a display device capable of producing sound.

Figure 3:
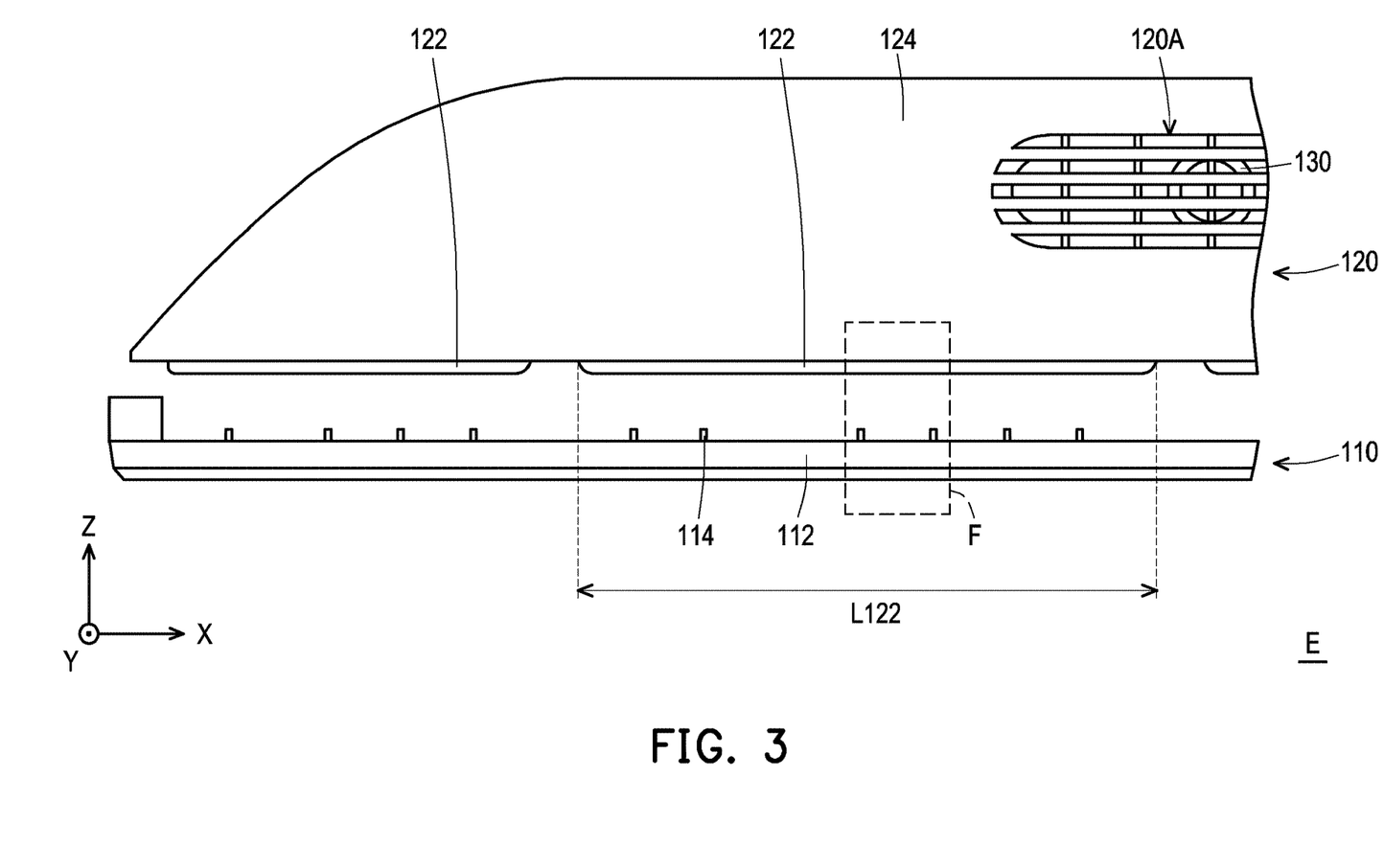
FIG. 3 is a disassembling schematic diagram of a first casing and a second casing in FIG. 2.
Figure 4:
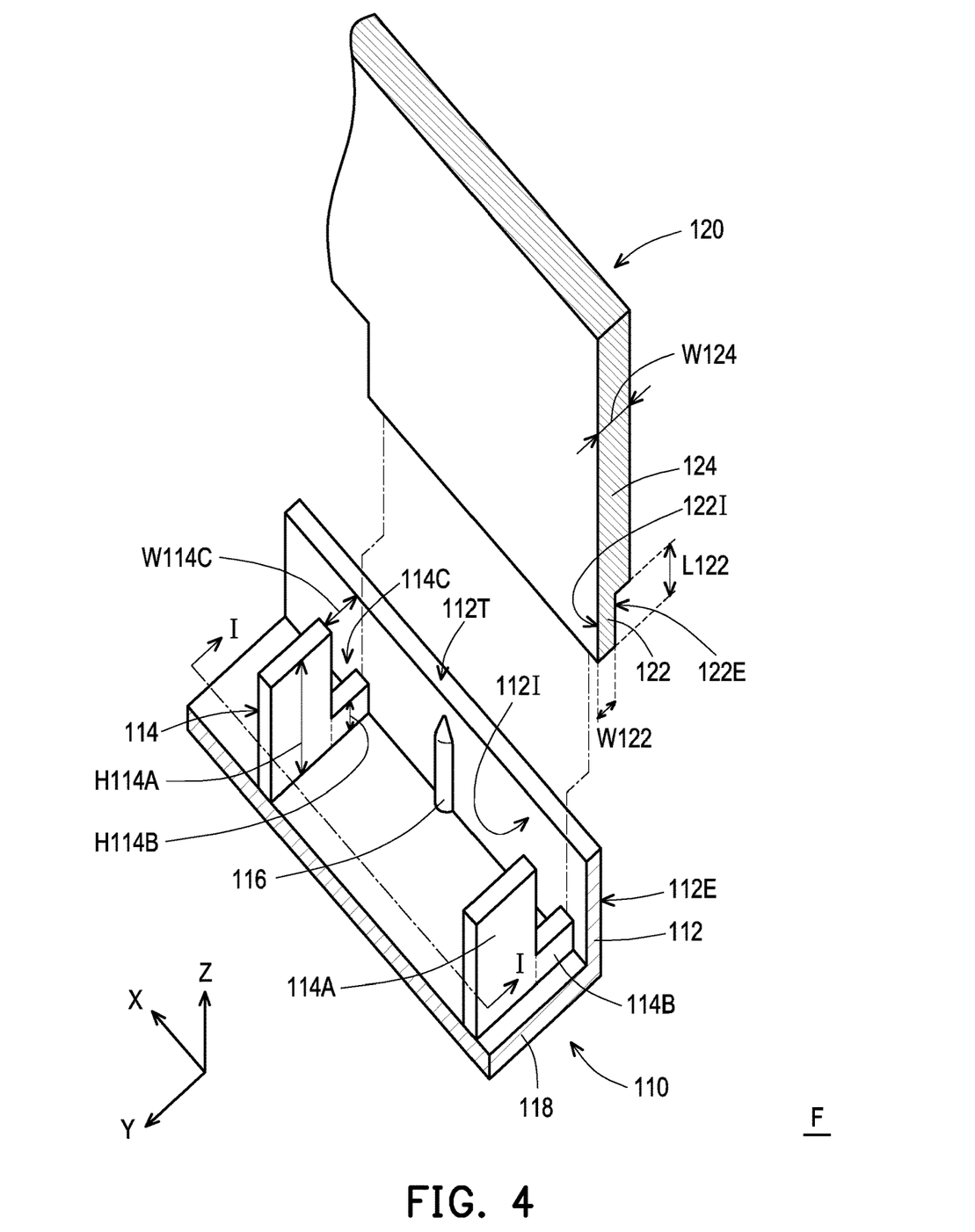
FIG. 4 is a partial three-dimensional schematic view of a region F of FIG. 3.

FIG. 3 is a disassembling schematic diagram of the first casing and the second casing in FIG. 2, and FIG. 4 is a partial three-dimensional schematic view of a region F of FIG. 3. As shown in FIGS. 3 and 4, the first casing 110 includes a first plate portion 112 and a first position-limiting structure 114, and the second casing 120 includes a protruding structure 122 and a second plate portion 124. The first plate portion 112 of the first casing 110 and the second plate portion 124 of the second casing 120 are adapted to abut each other. In FIG. 4, the first position-limiting structure 114 and an inner surface 1121 of the first plate portion 112 form a position-limiting groove 114C, and the protruding structure 122 connected to the second plate portion 124 and protruding from the second plate portion 124 may be disposed in the position-limiting groove 114C. In this way, the first plate portion 112 and the second plate portion 124 may abut each other to form a bottom of the electronic device 100 (the region E in FIG. 2).

As shown in FIG. 4, the first casing 110 may further include a second position-limiting structure 116 and a third plate portion 118. The second position-limiting structure 116 is disposed on the inner surface 1121 of the first plate portion 112. The third plate portion 118 is connected to the first plate portion 112. For example, in a cross section of the Y-axis and the Z-axis, the first plate portion 112 may extend along the Z-axis direction, and the third plate portion 118 may extend along the Y-axis direction from an end of the first plate portion 112. In this way, the first plate portion 112 and the third plate portion 118 may be connected in a cross-sectional shape similar to an L-shape, but the disclosure is not limited thereto. In the embodiment, a normal direction of the first plate portion 112 is, for example, the Y-axis direction, a normal direction of the third plate portion 118 is, for example, the Z-axis direction, and a normal line of the first plate portion 112 is intersected with a normal line of the third plate portion 118. The first position-limiting structure 114 may be disposed on the third plate portion 118. The first position-limiting structure 114 has a sheet or plate-like shape. In some embodiments, the first position-limiting structure 114 may extend along the Y-axis direction to be connected with the first plate portion 112, which helps to strengthen a mechanical property of the first casing 110. In some embodiments, the first position-limiting structure 114 may extend on a plane of the Y-axis and the Z-axis to have an approximate plate-like structure.

The first position-limiting structure 114 has a first portion 114A and a second portion 114B, the second portion 114B is located between the first portion 114A and the inner surface 1121 of the first plate portion 112, and a length of the first portion 114A protruding from the third plate portion 118 in the Z-axis direction, for example, the maximum length H114A, is greater than a length of the second portion 114B protruding from the third plate portion 118, for example, the maximum length H114B. In other words, in the Z-axis direction, a height of the second portion 114B is lower than a height of the first portion 114A, and the height of the second portion 114B is lower than a height of the first plate portion 112, and the position-limiting groove 114C is formed between the first portion 114A, the second portion 114B and the first plate portion 112.

As shown in FIG. 4, in the second casing 120, in the Y-axis direction, a width W122 of the protruding structure 122 may be less than a width W124 of the second plate portion 124. In a combined state of the first casing 110 and the second casing 120, the second plate portion 124 abuts an end 112T of the first plate portion 112, and the protruding structure 122 extends from the end 112T of the first plate portion 112 in a direction away from the second plate portion 124 and is disposed in the position-limiting groove 114C. In some embodiments, in the Y-axis direction, a width W114C of the position-limiting groove 114C may be a distance between the first portion 114A of the first position-limiting structure 114 and the inner surface 1121 of the first plate portion 112, and the width W114C of the position-limiting groove 114C may not be less than the width W122 of the protruding structure 122, which allows the protruding structure 122 to be inserted into the position-limiting groove 114C. In some embodiments, the width W122 of the protruding structure 122 is less than the width W114C of the position-limiting groove 114C to allow for dimensional variation caused by manufacturing errors. For example, the width W122 of the protruding structure 122 may be less than the width W114C of the position-limiting groove 114C by about 0.1 mm, but the disclosure is not limited thereto.

Figure 5:
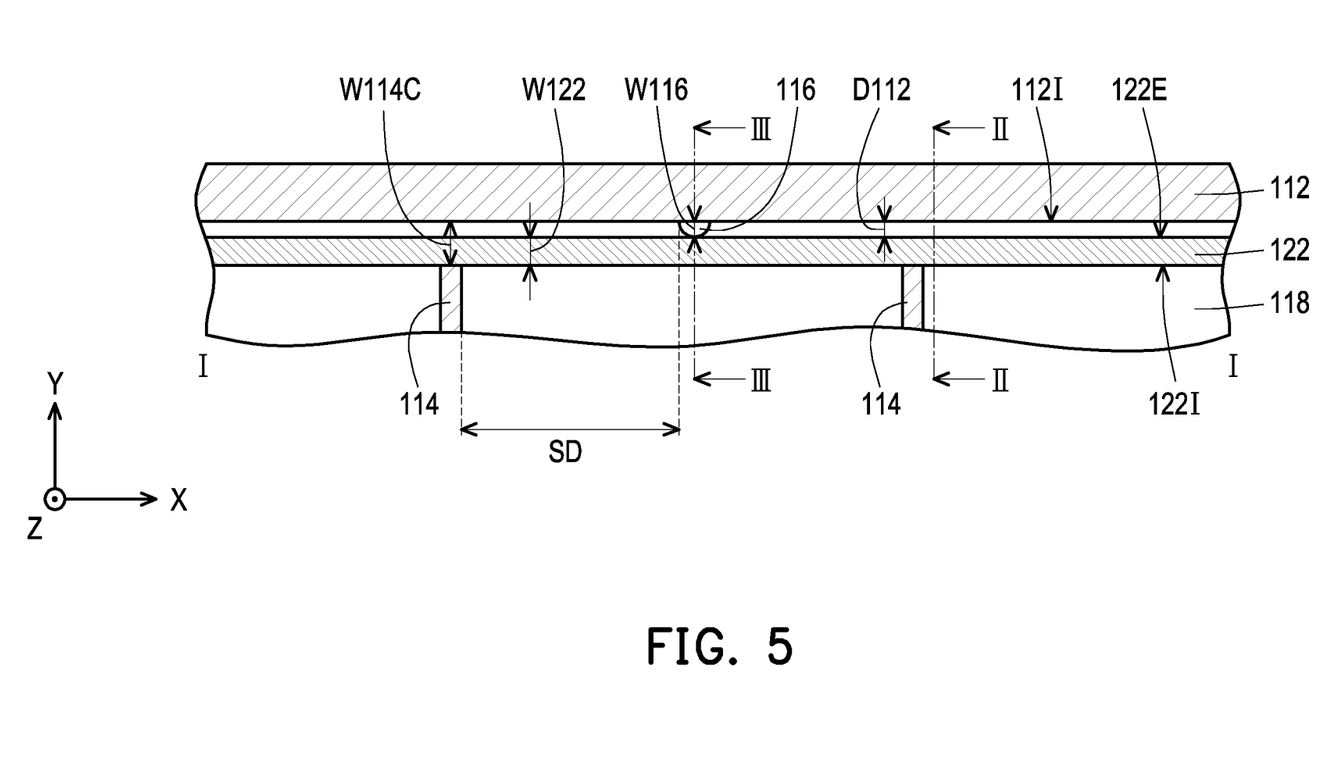
FIG. 5 is a schematic cross-sectional view of the first casing and the second casing of FIG. 4 along a line I-I in an assembled state.
Figure 6:
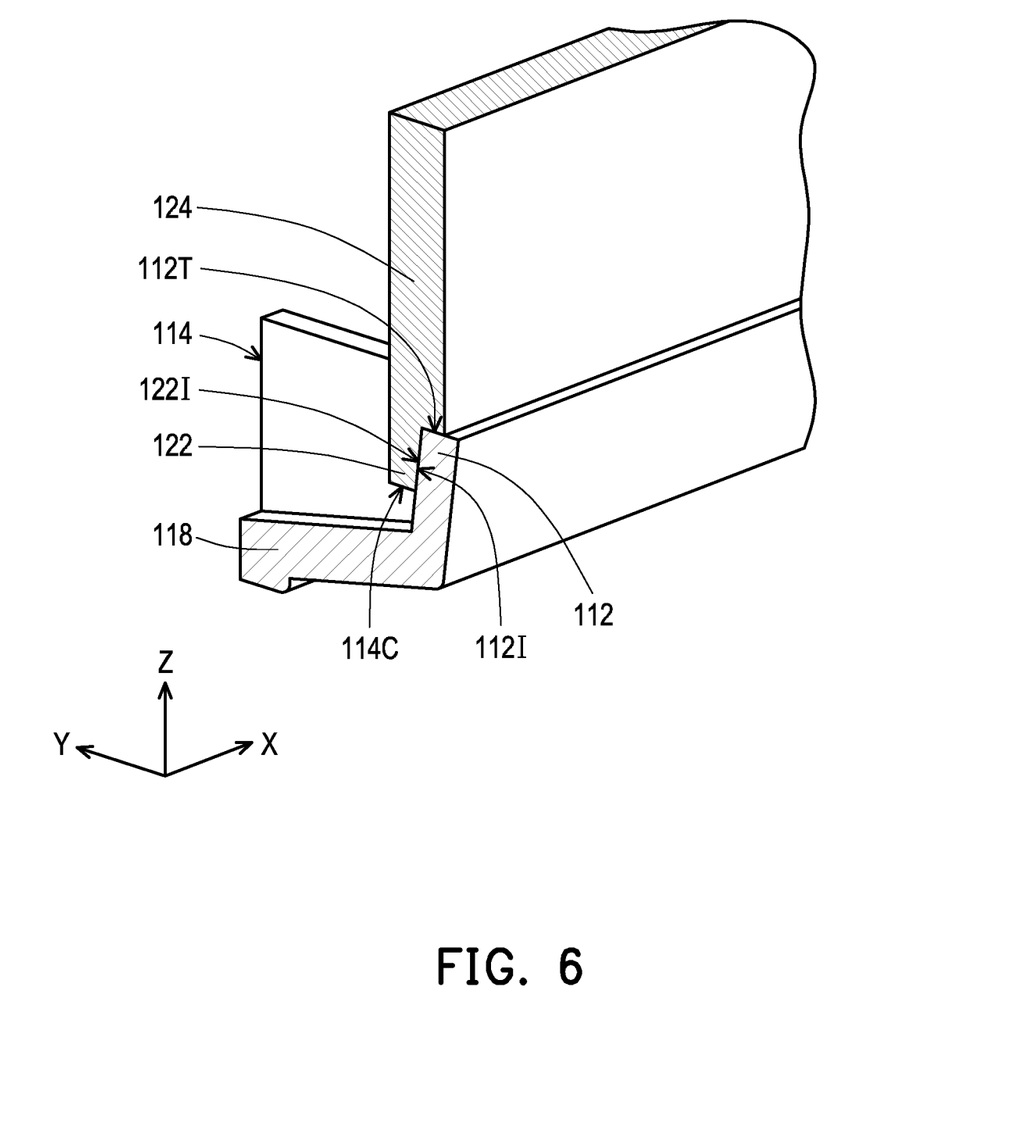
FIG. 6 and FIG. 7 are partial cross-sectional three-dimensional views along a line II-II and a line III-III of FIG. 5.
Figure 7:
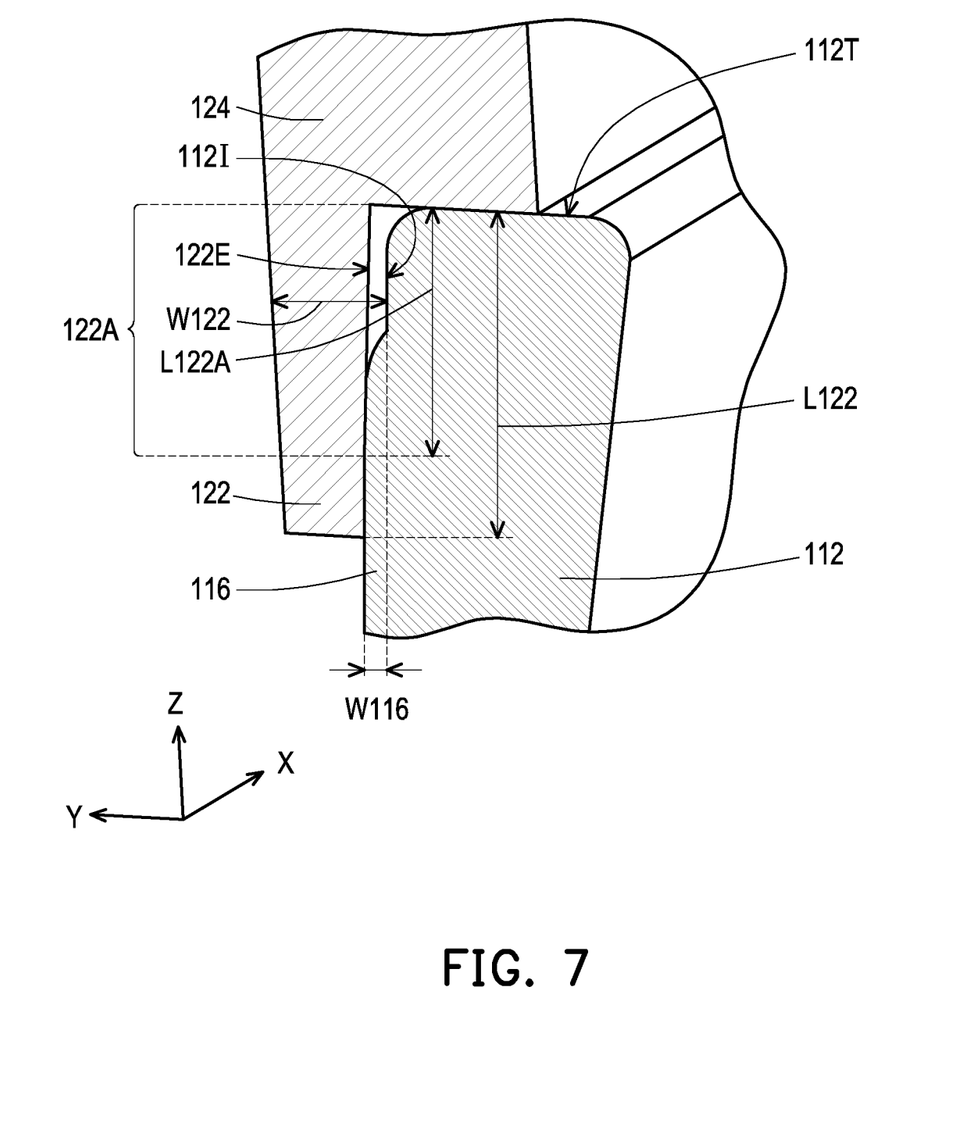

FIG. 5 is a schematic cross-sectional view of the first casing and the second casing of FIG. 4 along a line I-I in an assembled state. FIG. 6 and FIG. 7 are partial cross-sectional three-dimensional views along a line II-II and a line III-III of FIG. 5, where FIG. 6 shows the first position-limiting structure and FIG. 7 shows the second position-limiting structure. In the embodiment, the first position-limiting structure 114 and the second position-limiting structure 116 are arranged alternately in the X-axis direction, and are spaced apart from each other by a distance SD of, for example, 2 mm to 20 mm. The protruding structure 122 continuously extends between the first position-limiting structure 114 and the second position-limiting structure 116, and simultaneously contacts the first position-limiting structure 114 and the second position-limiting structure 116. Specifically, as shown in FIG. 5 and FIG. 6, when the protruding structure 122 of the second casing 120 is disposed in the position-limiting groove 114C of the first casing 110, the protruding structure 122 may be sandwiched between the first plate portion 112 and the first position-limiting structure 114. However, the first plate portion 112 and the protruding structure 122 may not be in direct contact. In some embodiments, the protruding structure 122 may be spaced apart from the inner surface 1121 of the first plate portion 112 by a distance D112, and the distance D112 is, for example, between 0.1 mm and 0.15 mm, but the disclosure is not limited thereto.

As shown in FIG. 5 and FIG. 7, when the protruding structure 122 of the second casing 120 is disposed in the position-limiting groove 114C of the first casing 110, the second position-limiting structure 116 is sandwiched between the protruding structure 122 and the first plate portion 112. A length of the second position-limiting structure 116 protruding from the inner surface 1121 of the first plate portion 112 in a direction away from the first plate portion 112, for example, the maximum length W116 may be between 0.1 mm and 1.2 mm. In some embodiments, a difference between the width W114C of the position-limiting groove 114C and the width W122 of the protruding structure 122 (which may be understood as the distance D112 between the protruding structure 122 and the inner surface 1121 of the first plate portion 112) may be less than the maximum length W116 of the second position-limiting structure 116 protruding from the inner surface 1121 of the first plate portion 112 in the direction away from the first plate portion 112. Therefore, as shown in FIG. 5, the first position-limiting structure 114 and the second position-limiting structure 116 may abut two opposite sides of the protruding structure 122. Specifically, when the first casing 110 and the second casing 120 are in the combined state, the first position-limiting structure 114 may contact the inner surface 1221 of the protruding structure 122 and the second position-limiting structure 116 may contact an outer surface 122E of the protruding structure 122. In addition, a structural interference of the first position-limiting structure 114 and the second position-limiting structure 116 to the protruding structure 122 may fix the protruding structure 122.

In some embodiments, the sound generating assembly 130 shown in FIG. 1 generates sound waves through vibration, which may cause vibration of the first casing 110 and the second casing 120. However, the first position-limiting structure 114 and the second position-limiting structure 116 in the embodiment may restrain the second casing 120 from being easily vibrated, thereby mitigating the situation that the second casing 120 and the first casing 110 collide with each other due to vibration. In this way, the abnormal sound caused by the collision between the second casing 120 and the first casing 110 may also be reduced, which helps to maintain a sound effect of the electronic device 100.

In some embodiments, as shown in FIG. 7, the protruding structure 122 includes an abutment portion 122A. The abutment portion 122A may be a portion of the protruding structure 122 adjoining the second plate portion 124. An extension length L122A of the abutment portion 122A extending from the end 112T of the first plate portion 112 in the direction away from the second plate portion 124 is less than or equal to 70% of an extension length L122 of the protruding structure 122 extending from the end 112T of the first plate portion 112 in the direction away from the second plate portion 124 as a whole. In this way, a section where the second position-limiting structure 116 interferes with the protruding structure 122 is not limited to the end of the protruding structure 122, but is substantially located in a middle part of the protruding structure 122, so that the second position-limiting structure 116 may abut the protruding structure 122 to reduce vibration of the protruding structure 122. However, the abutment portion 122A is not necessarily in contact with the second position-limiting structure 116 as a whole. In some embodiments, as long as a point at which the second limit structure 116 contacts the protruding structure 122 falls within a range of the abutment portion 122A, the vibration of the protruding structure 122 caused by an external force may all be reduced.

Figure 8:
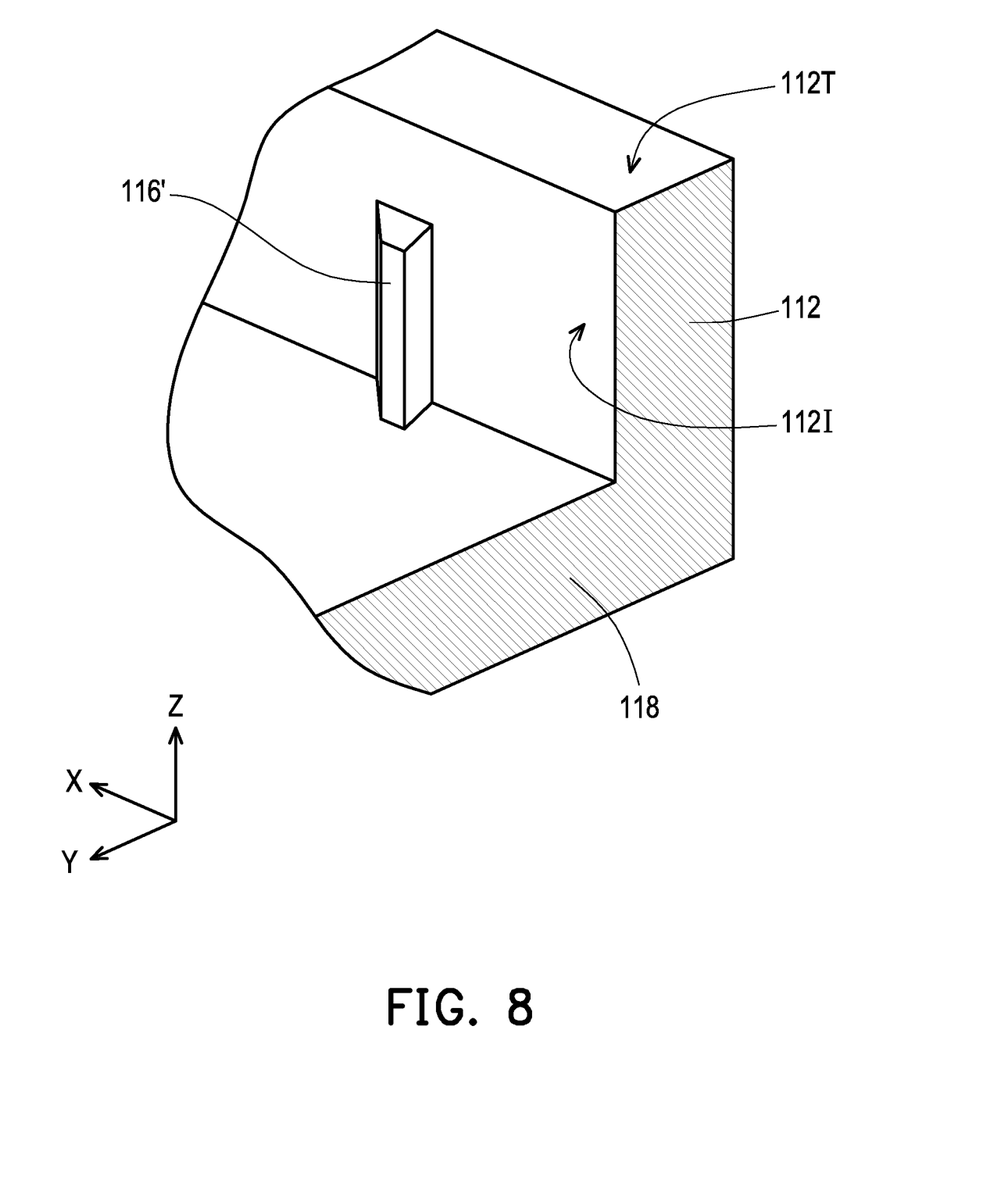
FIG. 8 is a partially enlarged cross-sectional three-dimensional view of a first casing according to an embodiment of the disclosure.
Figure 9:
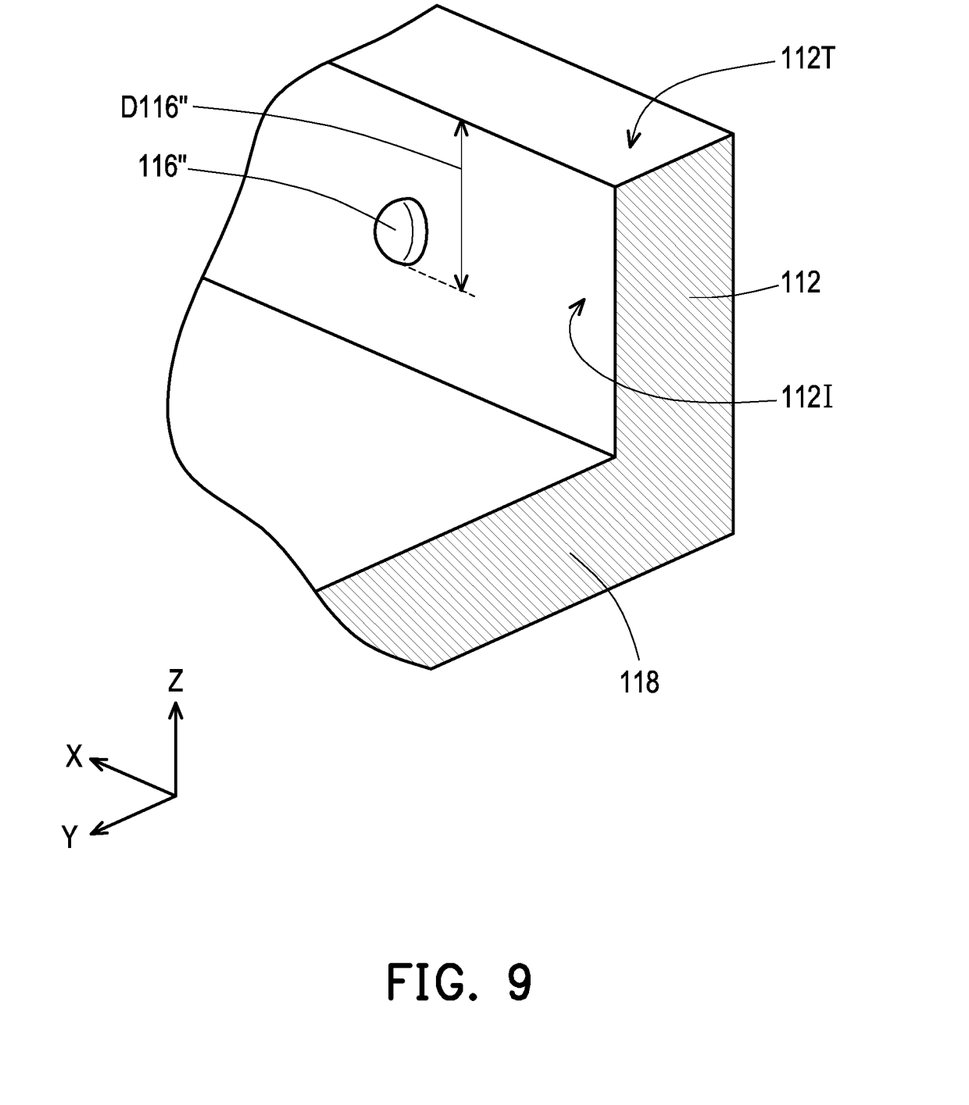
FIG. 9 is a partial enlarged cross-sectional three-dimensional view of a first casing according to an embodiment of the disclosure.
Figure 10:
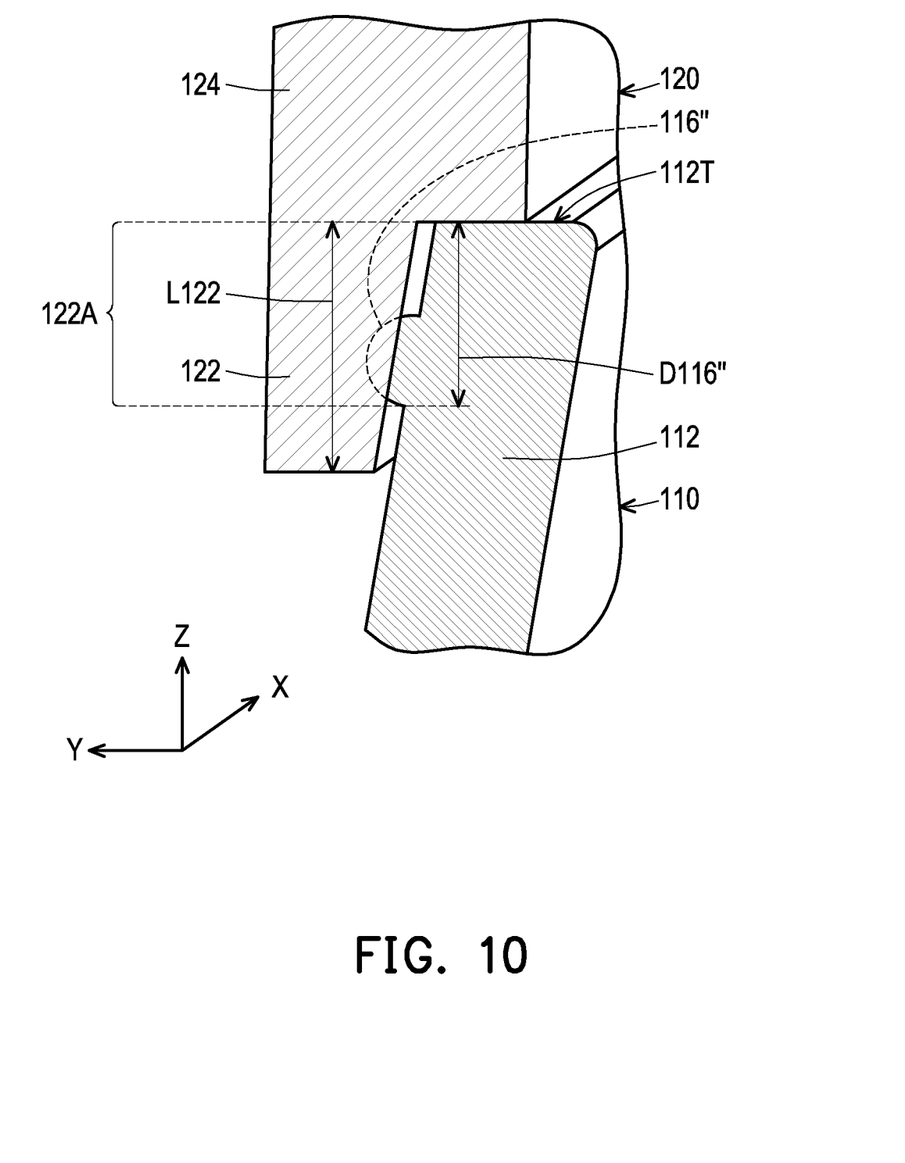
FIG. 10 is a schematic diagram of a combined state of the first casing and the second casing according to the embodiment of a second position-limiting structure of FIG. 9.

FIG. 8 is a partially enlarged cross-sectional three-dimensional view of a first casing according to an embodiment of the disclosure. In FIG. 8, a second position-limiting structure 116' has a polygonal columnar shape. Comparatively, the second position-limiting structure 116 in FIG. 4 has an approximately semi-cylindrical shape. In FIG. 4 and FIG. 8, the second position-limiting structure 116 and the second position-limiting structure 116' are both disposed on the inner surface 1121 of the first plate portion 112. The second position-limiting structure 116 and the second position-limiting structure 116', for example, extend from the third plate portion 118 along the inner surface 1121 of the first plate portion 112 in the direction away from the third plate portion 118 to gain a columnar shape, but the disclosure is not limited thereto. In the embodiment, a width of the second position-limiting structure 116' decreases as a distance between the second position-limiting structure 116' and the inner surface 1121 of the first plate portion 112 increases, but the disclosure is not limited thereto. FIG. 9 is a partial enlarged cross-sectional three-dimensional view of a first casing according to an embodiment of the disclosure. In FIG. 9, a second position-limiting structure 116" is disposed on the inner surface 1121 of the first plate portion 112, and the second position-limiting structure 116" has, for example, a hemispherical shape or a quasi-hemispherical shape. FIG. 10 is a schematic diagram of a combined state of the first casing and the second casing according to the embodiment of the second position-limiting structure 116" of FIG. 9. As shown in FIG. 9 and FIG. 10, in some embodiments, when the first casing 110 and the second casing 120 are combined, a distance D116" between a setting position of the hemispherical or quasi-hemispherical second position-limiting structure 116" and the end 112T of the first plate portion 112 may be within 70% of the overall extension length L122 of the protruding structure 122 extending from the end 112T of the first plate portion 112. Namely, the second position-limiting structure 116" contacts and abuts the abutment portion 122A of the protruding structure 122.

In some embodiments, the second position-limiting structure 116, 116' or 116" abuts the abutment portion 122A of the protruding structure 122, and the abutment portion 122A may be defined as a segment within 70% of the extension length L122 of the protruding structure 122 extending from the end 112T of the first plate portion 112 in the direction away from the second plate portion 124, which improve an effect of structural interference, so that the protruding structure 122 sandwiched between the first position-limiting structure 114 and the second position-limiting structure 116/116'/116''' is fixed and is not easy to vibrate due to the external force. Therefore, regardless of the external force during handling or use or the vibration force generated by the sound generating assembly 130 shown in FIG. 1, it is not easy to cause the first casing 110 or the second casing 120 to shake or vibrate, thereby reducing the occurrence of abnormal sounds. In this way, the electronic device 100 having the first position-limiting structure 114 and the second position-limiting structure 116/116'/116" of the aforementioned embodiment may have a good sound effect and reduce the abnormal sound caused by the mechanical vibration of the casings.

In addition, in the aforementioned embodiments, as shown in FIG. 3, the number of the protruding structure 122 on the second casing 120 may be multiple, and the extension length L122 of the protruding structure 122 extending along the X direction may be adjusted according to different requirements. Corresponding to the extension length L122 of the protruding structure 122, the numbers of the first position-limiting structure 114 and the second position-limiting structure 116/116' may also be adjusted. In some embodiments, when the extension length L122 of the protruding structure 122 is less than or equal to 50 mm, one second position-limiting structure 116/116'/116" may be correspondingly provided. When the extension length L122 of the protruding structure 122 is greater than 50 mm and less than or equal to 80 mm, two or more second position-limiting structures 116/116'/116" may be correspondingly provided.

When the extension length L122 of the protruding structure 122 is greater than 80 mm, one second position-limiting structure 116/116'/116" may be correspondingly provided every 40 mm. For example, when the extension length L122 of the protruding structure 122 is 48 mm, one second position-limiting structure 116/116'/116" may be correspondingly provided. When the extension length L122 of the protruding structure 122 is 150 mm, three second position-limiting structures 116/116'/116" may be correspondingly provided. When the same protruding structure 122 is correspondingly provided with a plurality of second position-limiting structures 116/116'/116", the second position-limiting structures 116/116'/116" may be arranged in the extension length L122 of the protruding structure 122 at equal intervals. In addition, a distance between the second position-limiting structures 116/116'/116" and the adjacent first position-limiting structure 114 may be at least 2 mm to 20 mm. In some embodiments, when the second casing 120 has a plurality of protruding structures 122, the second position-limiting structures 116/116'/116" may be selectively disposed corresponding to the protruding structures 122 close to a vibration source (for example, the sound generating assembly 130 in FIG. 1), and the protruding structures 122 farther away from the vibration source may not need to be correspondingly provided with the second position-limiting structures 116/116'/116", but the disclosure is not limited thereto. In some embodiments, the first plate portion 112, the first position-limiting structure 114, the second position-limiting structure 16/116'/116" and the third plate portion 118 in the first casing 110 may be formed integrally, and may be produced by a molding method of a same step. Similarly, the protruding structure 122 and the second plate portion 124 in the second casing 120 may also be formed integrally. A manufacturing method of the first casing 110 and the second casing 120 includes mold injection, mold casting, or other similar manufacturing methods, but the disclosure is not limited thereto.

In summary, the electronic device of the embodiment utilizes the first position-limiting structure and the second position-limiting structure in the first casing to abut the two opposite sides of the protruding structure of the second casing. Therefore, the first casing and the second casing do not easily vibrate under the external force. In the electronic device of the embodiments, abnormal sound caused by the vibration of the casings is unlikely to occur.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An electronic device, comprising: a first casing, comprising a first plate portion, a first position-limiting structure, and a second position-limiting structure, wherein the first position-limiting structure and an inner surface of the first plate portion form a position-limiting groove, and the second position-limiting structure is disposed on the inner surface of the first plate portion; and a second casing, comprising a protruding structure, wherein the protruding structure is inserted in the position-limiting groove, and the first position-limiting structure and the second position-limiting structure abut two opposite sides of the protruding structure respectively when the first casing and the second casing are paired to form a casing of the electronic device; and a width of the second position-limiting structure decreases as a distance between the second position-limiting structure and the inner surface of the first plate portion increases.

2. The electronic device according to claim 1, wherein the protruding structure is spaced apart from the inner surface by a distance, and the distance is between 0.1 mm and 0.15 mm.

3. The electronic device according to claim 1, wherein a length of the second position-limiting structure protruding from the inner surface of the first plate portion is between 0.1 mm and 1.2 mm.

4. The electronic device according to claim 1, wherein the first casing further comprises a third plate portion, the third plate portion is connected to the first plate portion, and a normal line of the first plate portion and a normal line of the third plate portion are intersected, the first position-limiting structure is disposed on the third plate portion, the first position-limiting structure has a first portion and a second portion, the second portion is located between the first portion and the inner surface of the first plate portion, and a length of the first portion protruding from the third plate portion is greater than a length of the second portion protruding from the third plate portion.

5. The electronic device according to claim 1, wherein the second position-limiting structure has a columnar shape.

6. The electronic device according to claim 1, wherein the second position-limiting structure has a hemispherical shape.

7. The electronic device according to claim 1, wherein the first position-limiting structure and the second position-limiting structure are arranged alternately with each other.

8. The electronic device according to claim 1, wherein the first position-limiting structure and the second position-limiting structure are spaced apart from each other by 2 mm to 20 mm.

9. The electronic device according to claim 1, wherein a difference between a width of the position-limiting groove and a length of the protruding structure is less than a length of the second position-limiting structure protruding from the inner surface of the first plate portion in a direction away from the first plate portion.

10. The electronic device according to claim 1, further comprising a sound generating assembly disposed on the second casing.

11. The electronic device according to claim 1, wherein the first position-limiting structure has a first portion and a second portion, the second portion is located between the first portion and the inner surface of the first plate portion, and a length of the first portion is greater than a length of the second portion.

12. The electronic device according to claim 11, wherein the first portion, the second portion, and the first plate portion form the position-limiting groove.

13. The electronic device according to claim 11, wherein a width of the position-limiting groove is equal to a distance between the first portion of the first position-limiting structure and the inner surface of the first plate portion.

14. The electronic device according to claim 1, wherein a width of the position-limiting groove is not less than a width of the protruding structure.

15. The electronic device according to claim 1, wherein the protruding structure continuously extends between the first position-limiting structure and the second position-limiting structure.

16. The electronic device according to claim 1, wherein the second casing further comprises a second plate portion, the protruding structure protrudes from the second plate portion, and the first plate portion of the first casing and the second plate portion of the second casing are adapted to abut each other.

17. The electronic device according to claim 16, wherein a width of the protruding structure is less than a width of the second plate portion.

18. The electronic device according to claim 1, wherein the protruding structure comprises an abutment portion, and an extension length of the abutment portion is less than or equal to 70% of an overall extension length of the protruding structure.

19. The electronic device according to claim 18, wherein a point at which the second position-limiting structure contacts the protruding structure falls on the abutment portion.

* * * * *